(12) United States Patent
Agrawal et al.

(10) Patent No.: US 7,573,291 B1
(45) Date of Patent: *Aug. 11, 2009

(54) PROGRAMMABLE LOGIC DEVICE WITH ENHANCED LOGIC BLOCK ARCHITECTURE

(75) Inventors: Om Agrawal, Los Altos, CA (US); Manish Garg, San Jose, CA (US); Chan-Chi Jason Cheng, Fremont, CA (US); Satwant Singh, Fremont, CA (US); Ju Shen, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 131 days.

This patent is subject to a terminal disclaimer.

(21) Appl. No.: 11/934,711

(22) Filed: Nov. 2, 2007

Related U.S. Application Data

(63) Continuation of application No. 11/200,983, filed on Aug. 9, 2005, now Pat. No. 7,295,035.

(51) Int. Cl.
*H03K 19/177* (2006.01)
(52) U.S. Cl. .......................................... 326/38; 326/41
(58) Field of Classification Search .............. 326/37–41
See application file for complete search history.

(56) References Cited

U.S. PATENT DOCUMENTS 7,295,035 B1 * 11/2007 Agrawal et al. ............... 326/38

* cited by examiner

*Primary Examiner*—Don P Le

(57) ABSTRACT

A programmable logic block within a programmable logic device includes at least two interconnected slices, each of the interconnect slices including at least two interconnected lookup tables. Each interconnected lookup table is adapted to receive input signals from a routing structure and to provide a LUT output signal. At least one of the slices includes a register adapted to register the LUT output signal of a lookup table and at least another of the slices includes fewer such registers than lookup tables.

22 Claims, 10 Drawing Sheets

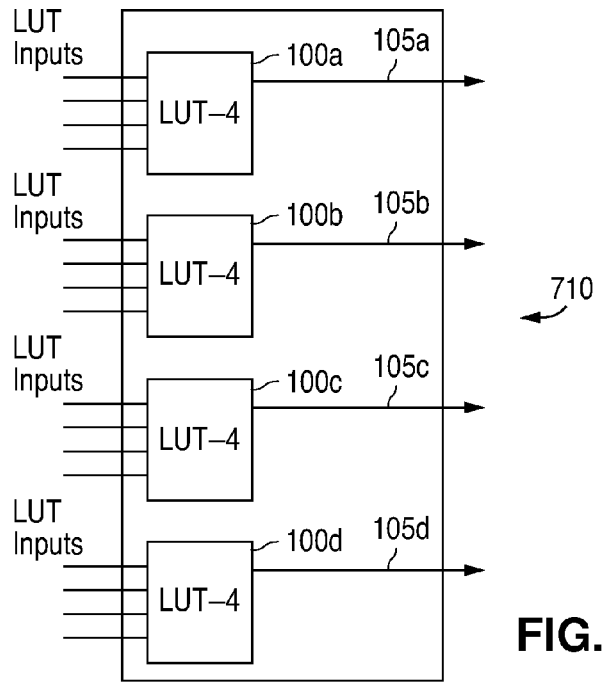
FIG. 7c
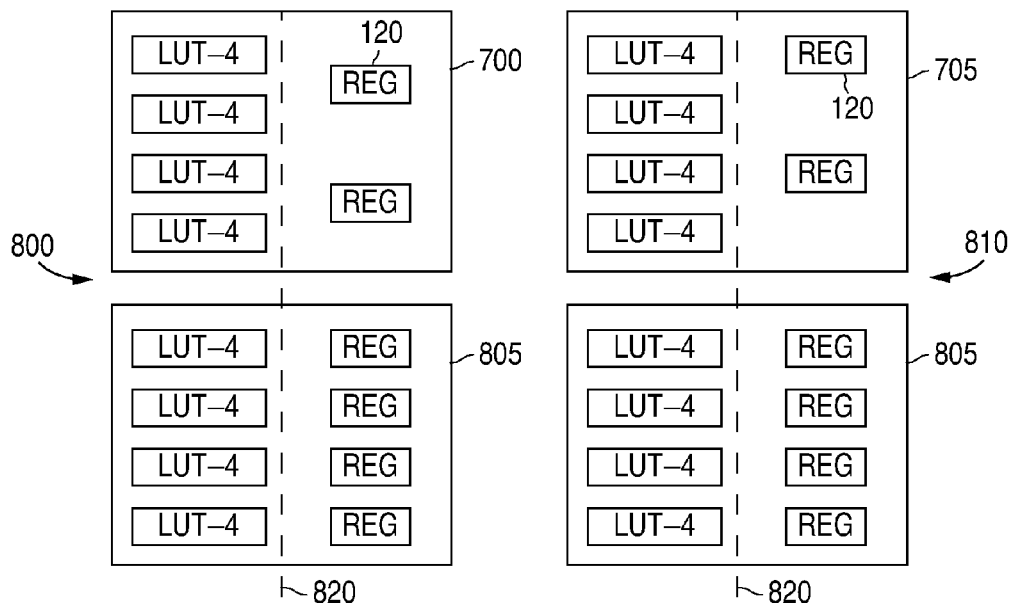
FIG. 8a
FIG. 8b

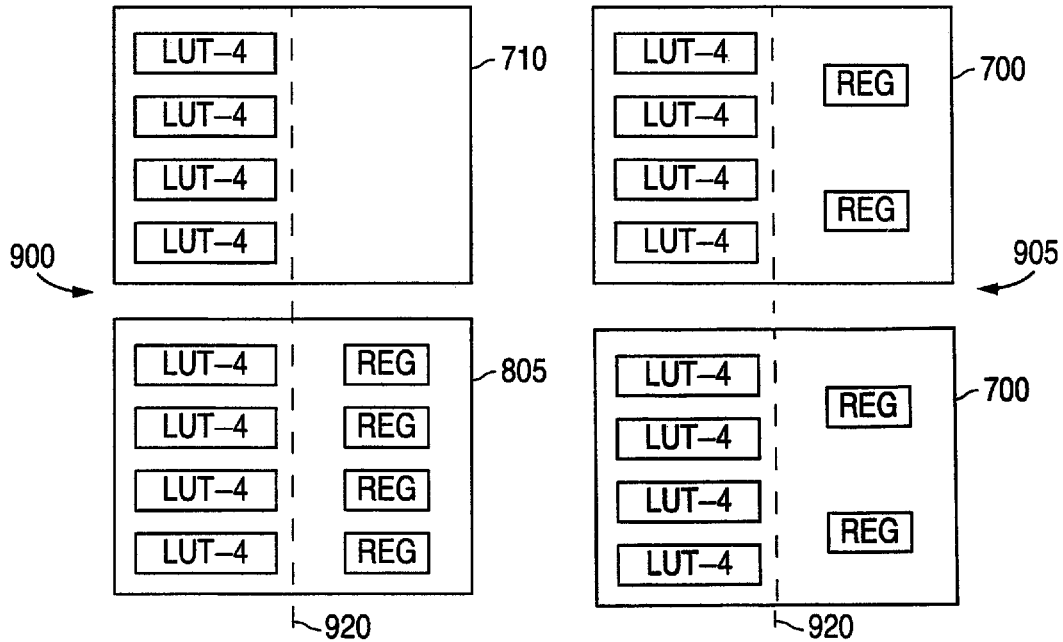
FIG. 9a  FIG. 9b
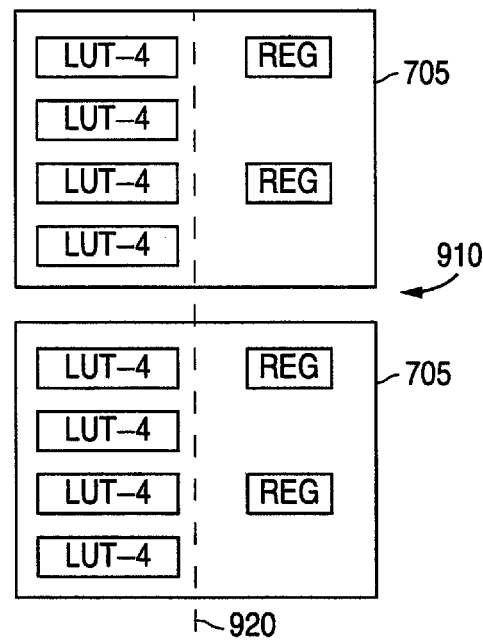
FIG. 9c

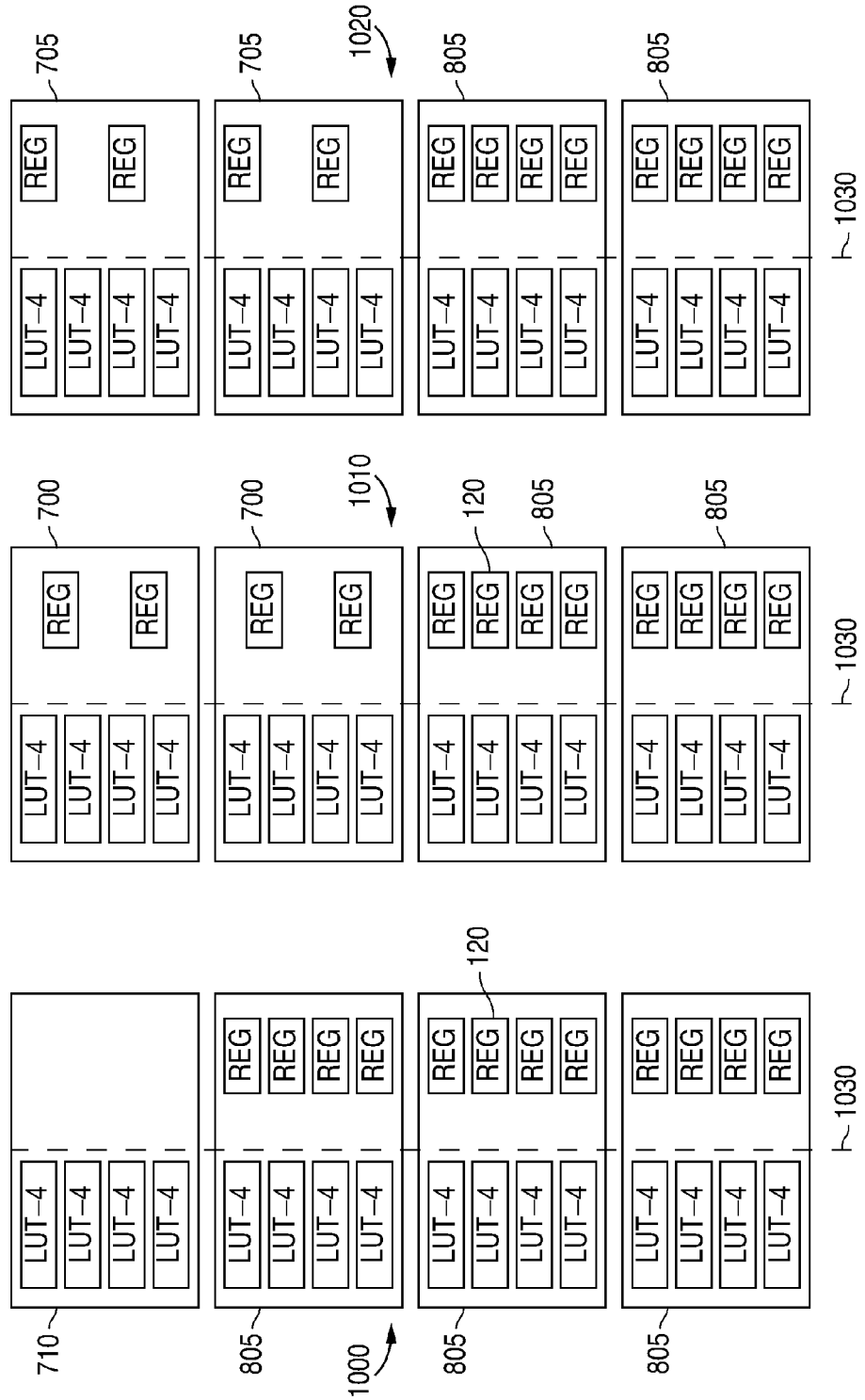

PROGRAMMABLE LOGIC DEVICE WITH ENHANCED LOGIC BLOCK ARCHITECTURE

RELATED APPLICATION DATA

This application is a continuation of U.S. application Ser. No. 11/200,983, filed Aug. 9, 2005, which is hereby incorporated by reference.

TECHNICAL FIELD

The present invention relates generally to programmable logic devices, and more particularly to a programmable logic block architecture.

BACKGROUND

Programmable logic devices such as field programmable gate arrays (FPGAs) include a number of programmable logic blocks that are interconnected by a programmable interconnect, also referred to as a routing structure. Each programmable logic block generally includes a number of lookup tables (LUTs). During FPGA configuration for logic use, a user programs the truth table for each lookup table to implement a desired logical function. The core unit of a programmable logic block is a LUT-register combination often denoted as a "logic cell" as seen in FIG. 1. A four-input (16 bit) LUT 100 receives LUT inputs A through D from the routing structure (not illustrated). Based upon the truth table programmed into LUT 100 during configuration of the corresponding FPGA, a combinatorial output 105 is "looked up" as determined by the state of inputs A through D. Output 105 may also be provided as a sequential output 110 after registration in a register 120. Register 120 may also register a data input 125 through appropriate selection in a multiplexer 130.

The core LUT/register logic cell combination discussed with respect to FIG. 1 may be organized into what is commonly referred to as a "slice." The bit size of a slice depends upon the number of LUT/register combinations it contains. For example, slice 200 illustrated in FIG. 2 contains two LUT/register combinations 205a and 205b and is thus a two-bit slice. Within slice 200, registers 120 share common set and reset signals 126. In addition, clock and clock enable signals 210 are also common to both registers 120a and 120b. A multiplexer 140 selects from combinatorial output signals 105a and 105b (from LUTs 100a and 100b, respectively) to provide an output signal FX0 160. Because both output signals 105a and 105b are "LUT4" outputs in that LUTs 100a and 100b are 4-input LUTs, FX0 160 represents a 5-input LUT (LUT5) output signal.

As seen in FIG. 3, a programmable logic block 300 may include a plurality of slices 200 such as slice-0 through slice-3. The bit size of the slices is arbitrary—for example, rather than use two-bit slices, programmable logic block 300 may include four-bit slices. As known in the art, various interconnections exist amongst slices 200 within programmable logic block 300. For example, as seen in FIG. 2, slice 200 may include a multiplexer 150 that selects from input signals FXA and FXB to provide an output signal FX1 170. In addition, a carry chain 180 couples across LUTs 100a and 100b. Carry chain 180 extends across all the LUTs (not illustrated) within slices 200 of programmable logic block 300 as well. To allow the formation of LUT6, LUT7, and LUT8 output signals (corresponding to the output signal of a 6-input LUT, a 7-input LUT, and an 8-input LUT, respectively), output signals FX1 and FX0 from each slice may couple back as inputs FXA and FXB in various fashions.

For example, in slice 0 (FIG. 3), input signal FXA is received as the FX0 output signal from slice 1 whereas input signal FXB is received as the slice 0 FX0 output signal. Because each FX0 output signal may be a LUT5 output signal as discussed with regard to FIG. 2, FX1 from slice 0 is thus a LUT6 output signal. An analogous situation exists for slice 2 in that its FXA input signal is received as the FX0 output signal from slice 3 whereas its FXB input signal may be the FX0 output signal from slice 2. Thus, the FX1 output signal from slice 3 may be a LUT6 output signal. But note that the FXA input signal for slice 1 is received as the FX1 output signal from slice 2. Similarly, the FXB input signal for slice 1 is received as the FX1 output signal from slice 0. Thus, the FX1 output signal from slice 1 is a LUT7 signal. To allow for the formation of a LUT8 output signal, slice 3 receives as its FXA input signal a LUT7 signal cascaded from another programmable logic block (not illustrated). Slice 3 also receives as its FXB input signal the FX1 output signal (LUT7) from slice 1. Thus, the FX1 output signal from slice 3 may be a LUT8 output signal. It will be appreciated that other types of interconnections exist between slices but are not shown for illustration clarity.

In certain FPGA designs, the bit size of the slice encompasses the entire programmable logic block in what may be denoted as a block-based approach such that all registers in a block-based programmable logic block receive common control signals. Regardless of the bit size used for the slices, it may be seen from examination of FIG. 2 that a one-to-one correspondence exists between LUTs 100 and registers 120 within each logic cell. The symmetry resulting from this one-to-one arrangement has obvious advantages such as ease of use. Synthesis, mapper, and placer and router tools have been optimized in view of this one-to-one correspondence. However, it has been observed that a register-to-LUT usage ratio for the vast majority of user designs ranges from 40% to 60%. A fixed one-to-one LUT-register ratio thus often results in a substantial waste of register resources. This waste leads to silicon die inefficiency and thus higher manufacturing costs.

Accordingly, there is a need in the art for improved programmable logic block architectures that provide a more efficient use of die area.

SUMMARY

A programmable logic block within a programmable logic device includes at least two interconnected slices, each of the interconnect slices including at least two interconnected lookup tables. Each interconnected lookup table is adapted to receive input signals from a routing structure and to provide a LUT output signal. At least one of the slices includes a register adapted to register the LUT output signal of a lookup table and at least another of the slices includes fewer such registers than lookup tables.

In one embodiment of the invention, the number of interconnected slices within the programmable logic block is four, the number of interconnected lookup tables in each slice is two, and the number of registers within the four slices is six.

In another embodiment of the invention, the number of interconnected slices within the programmable logic block is four, the number of interconnected lookup tables in each slice is two, and the number of registers within the four slices is four.

In another embodiment of the invention, the number of interconnected slices within the programmable logic block is two, the number of interconnected lookup tables in each slice is four, and the number of registers within the four slices is six.

In another embodiment of the invention, the number of interconnected slices within the programmable logic block is two, the number of interconnected lookup tables in each slice is four, and the number of registers within the four slices is four.

In another embodiment of the invention, the number of interconnected slices within the programmable logic block is four, the number of interconnected lookup tables in each slice is four, and the number of registers within the four slices is twelve.

In another embodiment of the invention, the number of interconnected slices within the programmable logic block is four, the number of interconnected lookup tables in each slice is four, and the number of registers within the four slices is eight.

BRIEF DESCRIPTION OF THE DRAWINGS

FIG. 7c illustrates a four-bit type D slice architecture in accordance with an embodiment of the invention.

FIG. 8a illustrates an eight-LUT programmable logic block architecture having a single four-bit type A slice and a single four-bit type B slice in accordance with an embodiment of the invention.

FIG. 8b illustrates an eight-LUT programmable logic block architecture having a single four-bit type A slice and a single four-bit type C slice in accordance with an embodiment of the invention.

FIG. 9a illustrates an eight-LUT programmable logic block architecture having a single four-bit type A slice and a single four-bit type D slice in accordance with an embodiment of the invention.

FIG. 9b illustrates an eight-LUT programmable logic block architecture having two four-bit type B slices in accordance with an embodiment of the invention.

FIG. 9c illustrates an eight-LUT programmable logic block architecture having two four-bit type C slices in accordance with an embodiment of the invention.

FIG. 10a illustrates a sixteen-LUT programmable logic block architecture having three four-bit type A slices and a single four-bit type D slice in accordance with an embodiment of the invention.

FIG. 10b illustrates a sixteen-LUT programmable logic block architecture having two four-bit type A slices and two four-bit type B slices in accordance with an embodiment of the invention.

FIG. 10c illustrates a sixteen-LUT programmable logic block architecture having two four-bit type A slices and two four-bit type C slices in accordance with an embodiment of the invention.

Use of the same reference symbols in different figures indicates similar or identical items.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
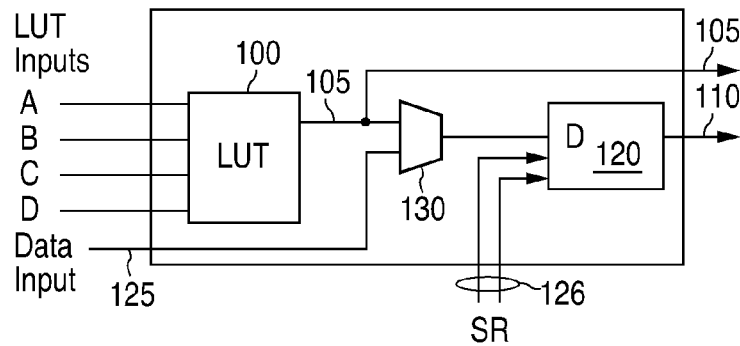
FIG. 1 is a block diagram of a conventional logic cell architecture.
Figure 2:
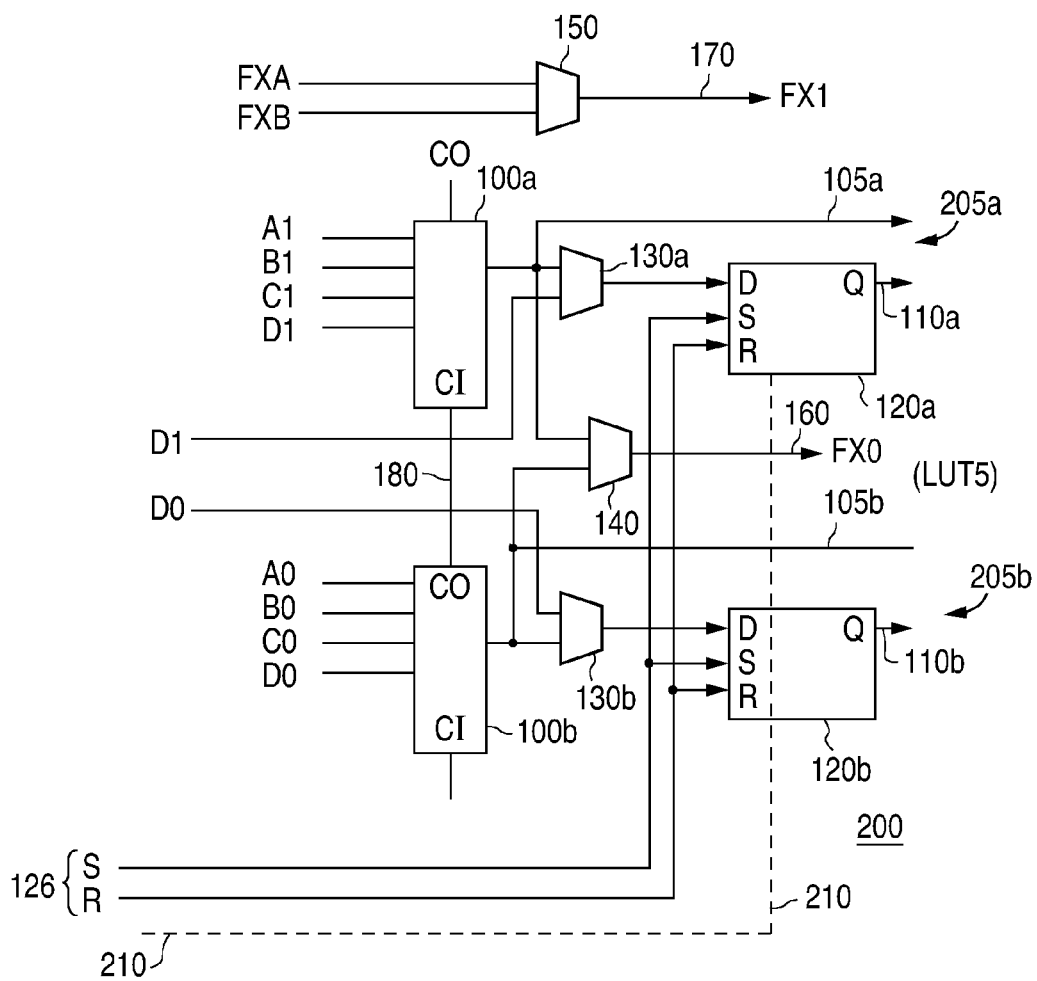
FIG. 2 is a block diagram of a conventional type two-bit slice, which is denoted herein as a type A slice
Figure 3:
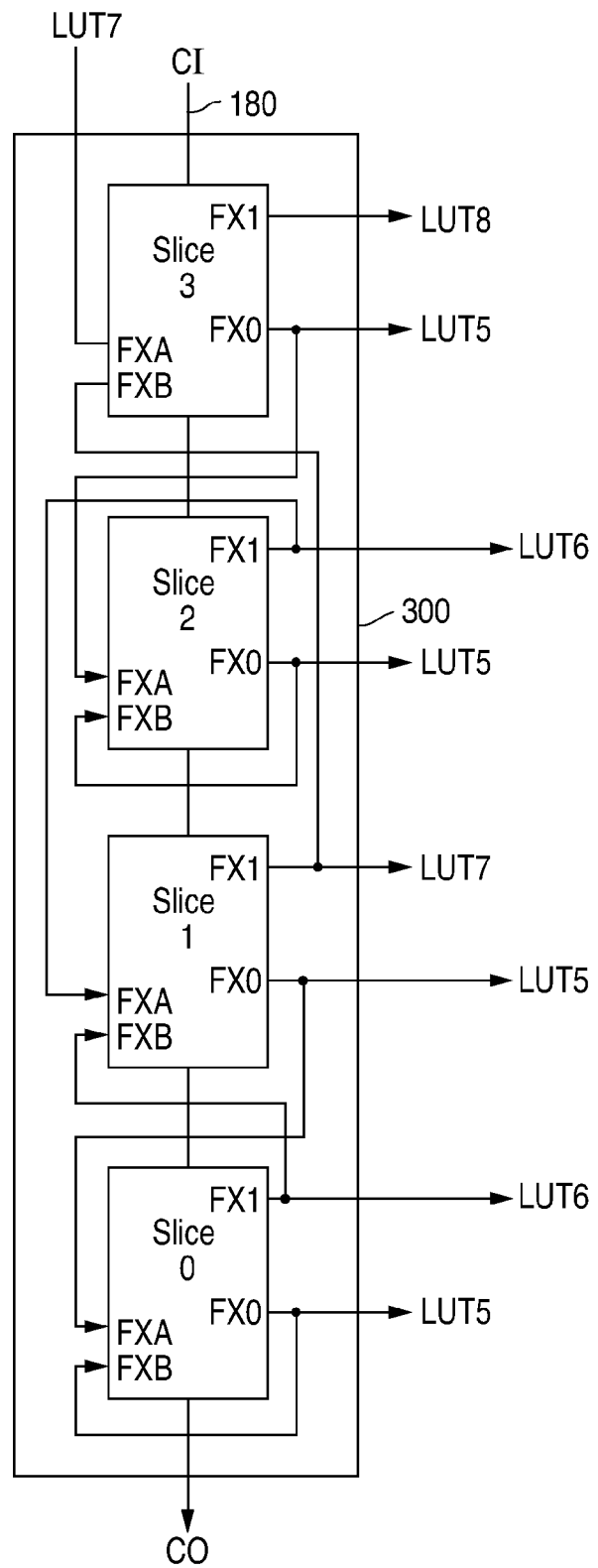
FIG. 3 is a block diagram of a conventional programmable logic block.
Figure 4A:
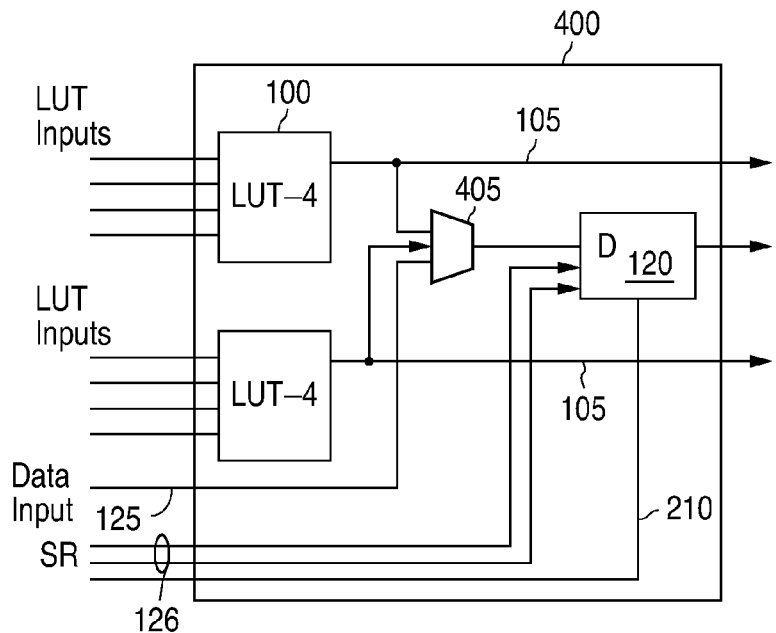
FIG. 4a is a block diagram of a two-bit slice (denoted herein as a type B slice) in which a single register may register either LUT output signal in accordance with an embodiment of the invention.

An improved programmable logic block architecture is provided for programmable logic devices such as FPGAs. This improved architecture may be used regardless of the slice bit size. Certain slices within a programmable logic block will not have a one-to-one LUT/register ratio whereas other slices within the programmable logic block may possess a one-to-one LUT/register ratio. For example, in a 2-bit slice architecture, a conventional one-to-one LUT/register slice such as slice 200 of FIG. 2 may be denoted as an "type A" slice. Slices having a reduced register/LUT ratio may be constructed using a number of alternative embodiments. As seen in FIG. 4a, a two-bit slice 400 includes a single register 120 for both LUTs 100. In this embodiment and with the FPGA in logic mode, a three-to-one multiplexer 405 receives both combinatorial outputs 105 from LUTs 100 as well as data input 125 to select for a data input D to register 120. As used herein, two-bit slice 400 will be referred to as a "type B" slice.

Figure 4B:
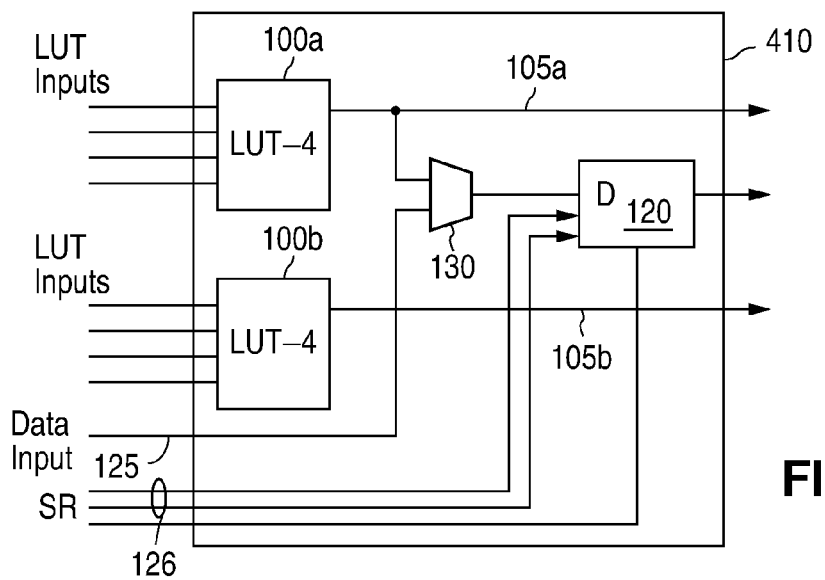
FIG. 4b is a block diagram of a two-bit slice (denoted herein as a type C slice) in which a single register may register only a first one of the LUT outputs in accordance with an embodiment of the invention.

An alternative embodiment for a two-bit slice having a reduced register/LUT ratio is illustrated in FIG. 4b. A two-bit slice 410 includes a first LUT 100a providing a combinatorial output 105a and a second LUT 100b providing a combinatorial output 105b. However, in contrast to slice type B, only combinatorial output 105a may be registered in register 120. Thus, multiplexer 130 selects only between combinatorial output 105a and data input 125. Combinatorial output 105b thus cannot be registered in two-bit slice 410. As used herein, two-bit slice 410 will be referred to as a "type C" slice.

Figure 4C:
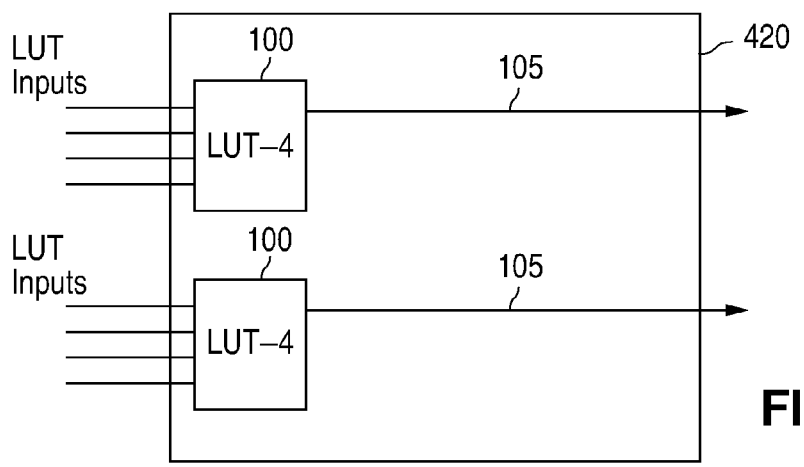
FIG. 4c is a block diagram of a two-bit slice (denoted herein as a type D slice) that does not include a register in accordance with an embodiment of the invention.

Another alternative embodiment for a two-bit slice having a reduced register/LUT ratio is illustrated in FIG. 4c. A two-bit slice 420 includes two LUTs 100 wherein each LUT provides a combinatorial output 105 as discussed above. However, two-bit slice 420 does not include a register. Thus, two-bit slice 420 can only provide combinatorial outputs 105 and cannot provide a sequential output as would be the case if it included a register. Because no register is included, two-bit slice 420 does not receive a data input 125. As used herein, two-bit slice 420 will be referred to as a "type D" slice.

Given these illustrative two-bit slice embodiments having reduced register/LUT ratios, their inclusion within a programmable logic block architecture will now be addressed. For example, consider a programmable logic block that includes eight LUTs. An eight-LUT programmable logic block may include 4 two-bit slices. If conventional type A slices were used, this eight-LUT programmable logic block would include eight registers. To save die space and eliminate little or seldom-used registers, eight-LUT programmable logic blocks are described herein that do not include eight registers. The number of registers may range from seven to zero in an eight-LUT programmable logic block having a reduced register/LUT ratio. Including no registers strongly impacts design flexibility. However, including seven registers provides only minor die space savings. It has been observed that a set of six registers provides a sufficient design flexibility vs. die space savings tradeoff. Thus, the following discussion will show various embodiments for a six-register-eight-LUT programmable logic block. It will be appreciated, however, that the number of registers within a programmable logic block having a reduced register/LUT ratio is not limited to a particular value such as six.

Figures 5A, 5B, 5C:
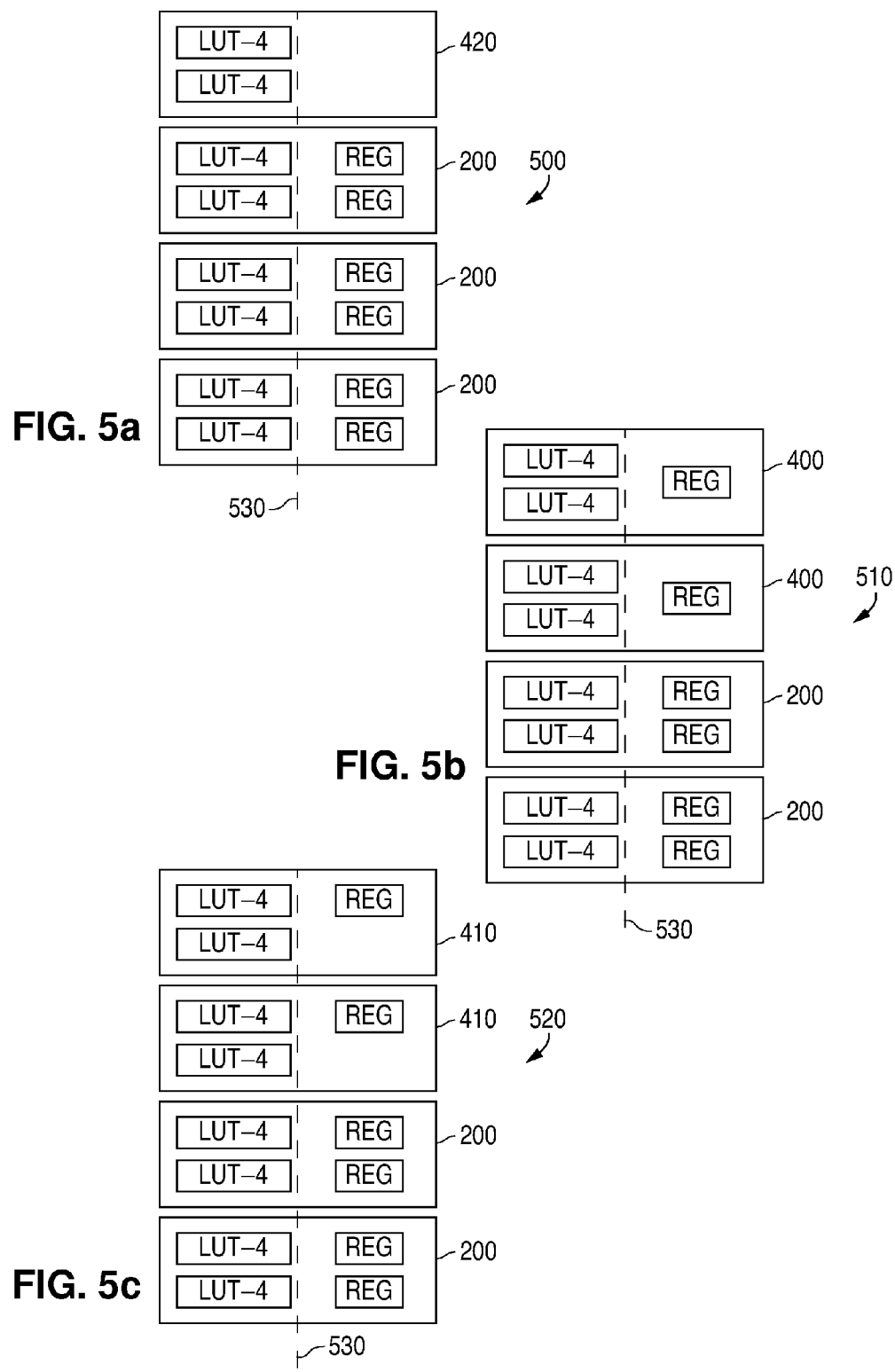
FIG. 5a illustrates an eight-LUT programmable logic block including three two-bit type A slices and a single two-bit type D slice in accordance with an embodiment of the invention.
FIG. 5b illustrates an eight-LUT programmable logic block including two two-bit type A slices and two two-bit type B slices in accordance with an embodiment of the invention.
FIG. 5c illustrates an eight-LUT programmable logic block including two two-bit type A slices and two two-bit type C slices in accordance with an embodiment of the invention.

Turning now to FIG. 5a, an eight-LUT programmable logic block 500 includes three type A slices 200. Because three type A slices 200 will provide six registers 120 (as can be seen from inspection of FIG. 2), the remaining slice in programmable logic block 500 is a type D slice 420 so that the total number of registers 120 equals six. An alternative embodiment is illustrated in FIG. 5b for a programmable logic block 510 that includes two type A slices 200. Because two type A slices 200 will provide four registers 120, programmable logic block 510 also includes two type B slices 400 so that the total number of registers 120 equals six. Another alternative embodiment is illustrated in FIG. 5c for a programmable logic block 520 that also includes two type A slices 200. Rather than use two type B slices, programmable logic block 520 includes two type C slices 410 so that the total number of registers 120 equals six. It will be appreciated that other alternative embodiments may also be constructed. For example, as an alternative to two type C slices in programmable logic block 520, a single type B and a single type C slice could have been included. For illustration clarity, the interconnections described previously within and between the slices in programmable logic blocks 500, 510, and 530 are represented by a dotted line 530.

Figures 6A, 6B, 6C:
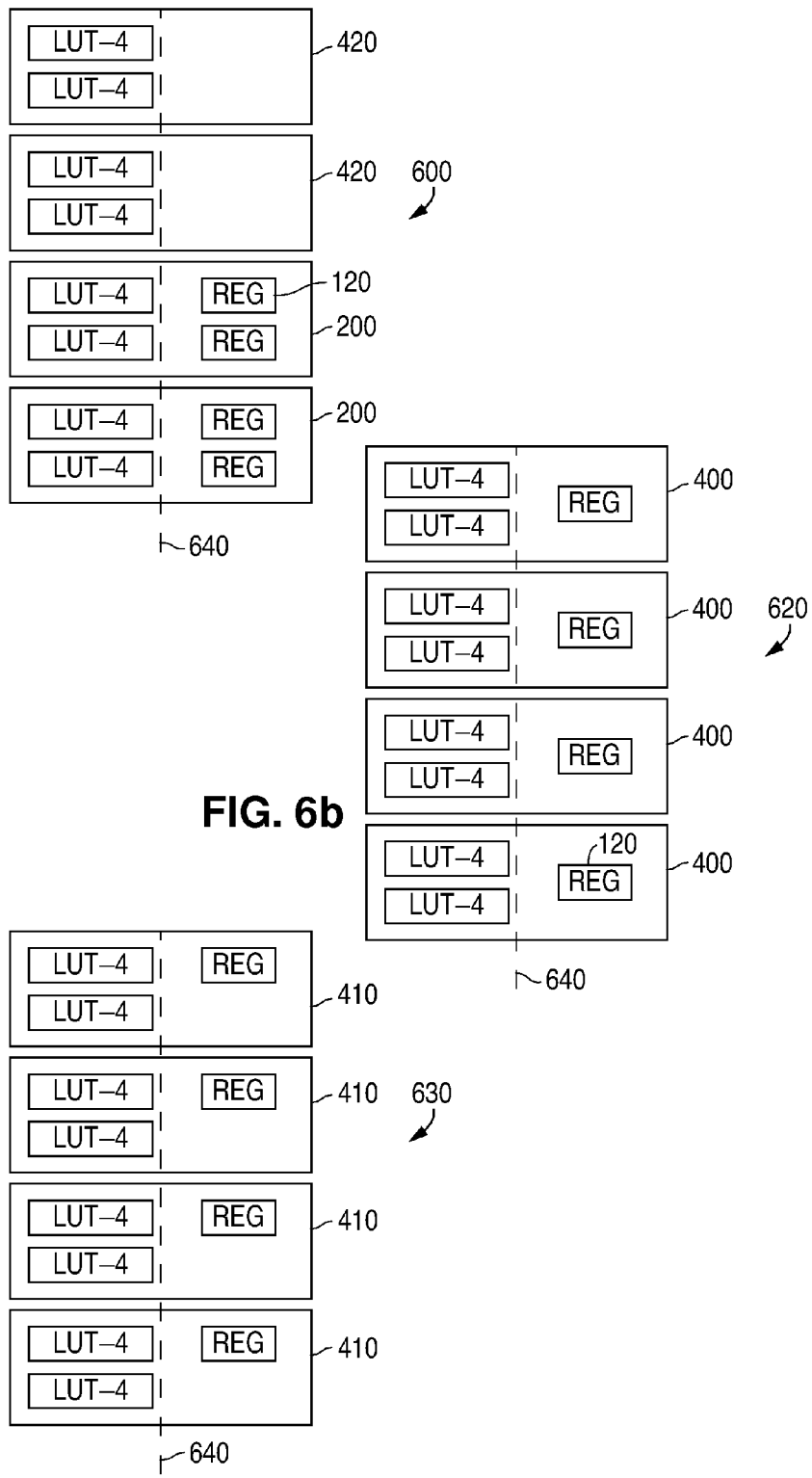
FIG. 6a illustrates an eight-LUT programmable logic block including two two-bit type A slices and two two-bit type D slices in accordance with an embodiment of the invention.
FIG. 6b illustrates an eight-LUT programmable logic block including four two-bit type B slices in accordance with an embodiment of the invention.
FIG. 6c illustrates an eight-LUT programmable logic block including four two-bit type C slices in accordance with an embodiment of the invention.

Rather than use six registers within each eight-LUT programmable logic block, alternative embodiments may be constructed using a different number of registers. For example, FIG. 6a illustrates an eight-LUT programmable logic block 600 that includes two type A slices 200 and two type D slices 420. Thus, programmable logic block 600 includes just four registers 120. An alternative embodiment for a four-register architecture as illustrated in FIG. 6b for which an eight-LUT programmable logic block 620 includes four type B slices 400. As seen in FIG. 6c, a four-register slice architecture may also be achieved using four type C slices 410 in an 8-LUT programmable logic block 630. A four-register slice architecture may also be achieved using a mixture of type B and C slices. For illustration clarity, the interconnections within and between the slices in programmable logic blocks 600, 620, and 630 are represented by a dotted line 640.

Figure 7A:
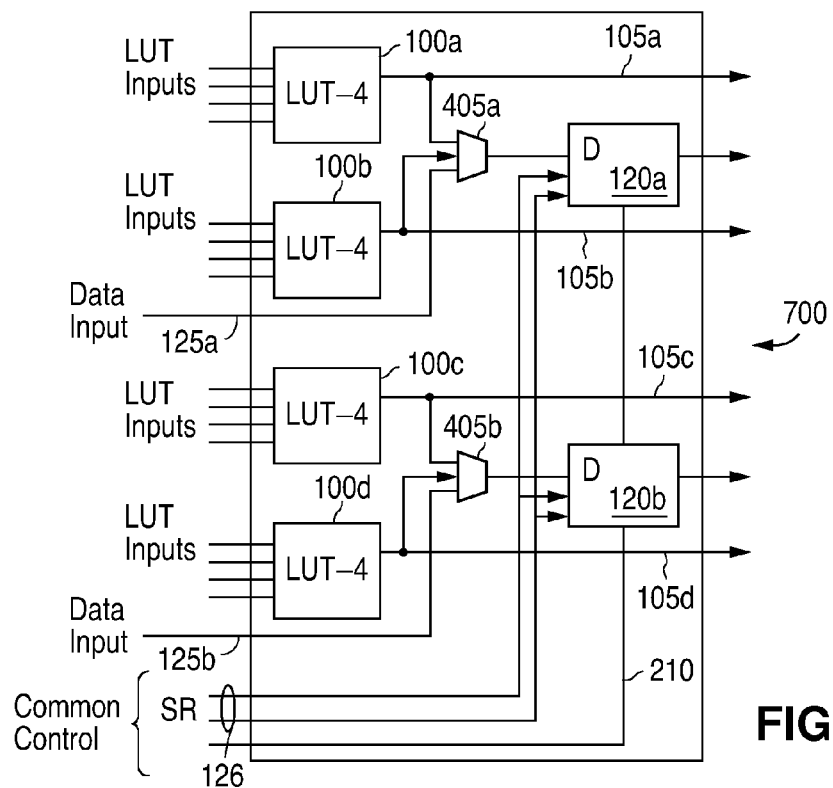
FIG. 7a illustrates a four-bit type B slice architecture in accordance with an embodiment of the invention.

As discussed above, the number of bits within each slice need not be limited to two bits. A conventional four-bit slice has a one-to-one register-to-LUT ratio and thus has a type A architecture as discussed analogously with respect to FIG. 2. This ratio may be reduced as seen in FIG. 7a for a four-bit slice 700 having a type B slice architecture. Thus, a combinatorial output 105a from a LUT 100a or a combinatorial output 105b from a LUT 100b may be registered in a register 120a through appropriate selection in a multiplexer 405a that may also select for a data input 125a. Similarly, a combinatorial output 105c from a LUT 100c or a combinatorial output 105d from a LUT 100d may be registered in a register 120b through appropriate selection by a multiplexer 405b that may also select for a data input 125b.

Figure 7B:
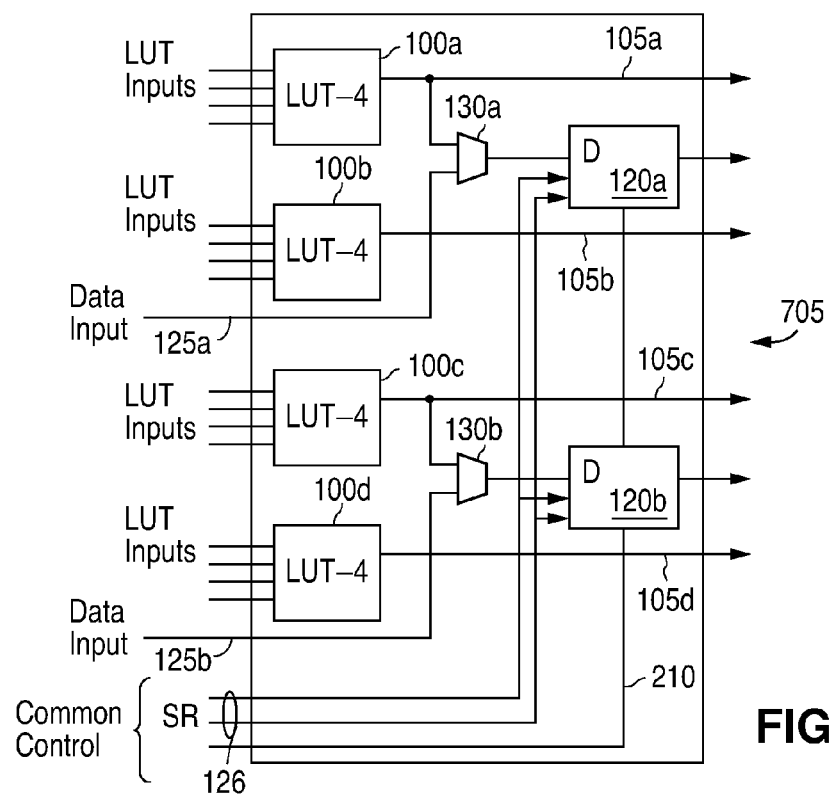
FIG. 7b illustrates a four-bit type C slice architecture in accordance with an embodiment of the invention.

A four-bit slice 705 having a type C architecture is illustrated in FIG. 7b. As discussed analogously with respect to FIG. 4b, combinatorial output 105a from a LUT 100a may be registered in a register 120a through appropriate selection by a multiplexer 130a. Multiplexer 130a may also select for a data input 125a. Similarly, a combinatorial output 105c from LUT 100c may be registered in a register 120b through appropriate selection by a multiplexer 130b. Multiplexer 130b may also select for a data input 125b. A combinatorial output 105b from a LUT 100b and a combinatorial output 105d from a LUT 100d cannot be registered in slice 705.

A four-bit slice 710 having a type D architecture is illustrated in FIG. 7c. In a type D slice architecture, no registers are provided to register the LUT combinatorial outputs. Thus, combinatorial outputs 105a through 105d from respective LUTs 100a through 100d cannot be registered in slice 710.

The type A through type D four-bit slices discussed above may be organized in various ways to form eight-LUT programmable logic blocks. For example, as seen in FIG. 8a, a programmable logic block 800 may include a four-bit type A slice 805 and a four-bit type B slice 700. Thus, programmable logic block 800 includes six registers 120. An alternative embodiment for an eight-LUT, 6-register programmable logic block is illustrated in FIG. 8b with respect to a programmable logic block 810. Programmable logic block 810 includes a 4-bit type A slice 805 and a four-bit type C slice 705. For illustration clarity, the interconnections between the slices in programmable logic blocks 800 and 810 are represented by a dotted line 820.

Other eight-LUT programmable logic block architectures that incorporate 4-bit slices may be constructed with less than six registers 120. For example, as seen in FIG. 9a, an eight-LUT programmable logic block 900 includes a single four-bit type A slice 805 and a single four-bit type D slice 710.

Alternatively, as seen in FIG. 9b, an eight-LUT programmable logic block 905 includes two four-bit type B slices 700. In yet another alternative embodiment as seen in FIG. 9c, an eight-LUT programmable logic block 910 includes two four-bit type C slices 705. For illustration clarity, the interconnections between the slices in programmable logic blocks 900, 905, and 910 are represented by dotted lines 920.

Four-bit slices may also be used to construct sixteen-LUT programmable logic blocks (which could also be constructed with two-bit slices). Turning now to FIG. 10a, a sixteen-LUT programmable logic block 1000 includes three four-bit type A slices 805 and a single four-bit type D slice 710. Thus, programmable logic block 1000 includes twelve registers 120. Other sixteen-LUT programmable logic block architectures having 12 registers and four-bit slice granularity may be constructed. For example, as illustrated in FIG. 10b, a programmable logic block 1010 includes two four-bit type A slices 805 and two four-bit type B slices 700. Another alternative embodiment is shown in FIG. 10c for a programmable logic block 1020 that includes two four-bit type A slices 805 and two four-bit type C slices 705. For illustration clarity, the interconnections between the slices in programmable logic blocks 1000, 1010, and 1020 are represented by dotted lines 1030.

Figures 11A, 11B, 11C:
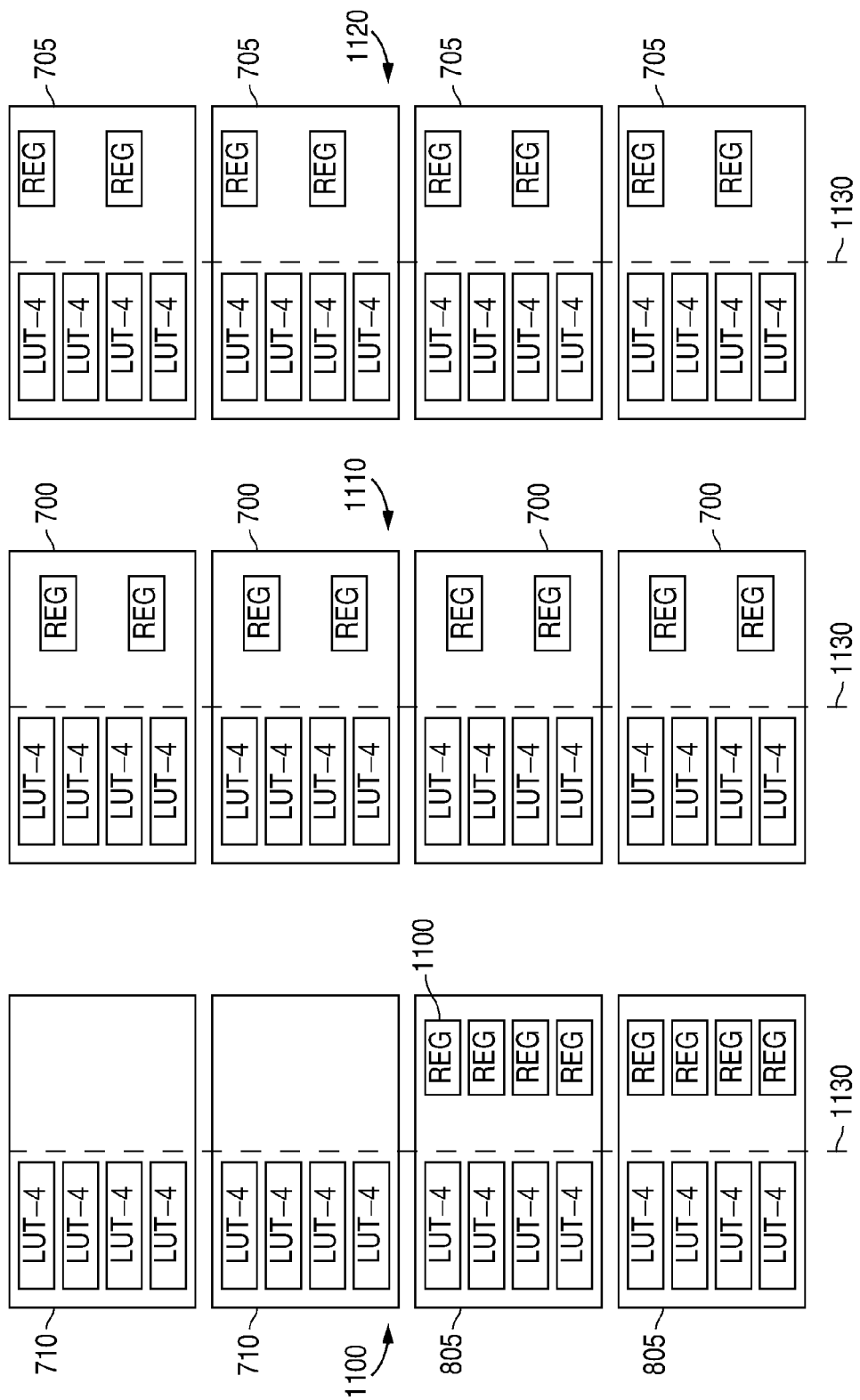
FIG. 11a illustrates a sixteen-LUT programmable logic block architecture having two four-bit type A slices and two four-bit type D slices in accordance with an embodiment of the invention.
FIG. 11b illustrates a sixteen-LUT programmable logic block architecture having four four-bit type B slices in accordance with an embodiment of the invention.
FIG. 11c illustrates a sixteen-LUT programmable logic block architecture having four four-bit type C slices in accordance with an embodiment of the invention.

Turning now to FIG. 11a, a sixteen-LUT programmable logic block 1100 having eight registers 120 and a four-bit slice granularity is illustrated. Programmable logic block 1100 includes two four-bit type A slices 805 and two four-bit type D slices 710. Similarly, as seen in FIG. 11b, a sixteen-LUT programmable logic block 1100 includes four four-bit type B slices 700. In an alternative architecture illustrated in FIG. 11c, a sixteen-LUT programmable logic block 1120 includes four four-bit type C slices 705. For illustration clarity, the interconnections between the slices in programmable logic blocks 1100, 1110, and 1120 are represented by dotted lines 1130.

The above-described embodiments of the present invention are merely meant to be illustrative and not limiting. It will thus be obvious to those skilled in the art that various changes and modifications may be made without departing from this invention in its broader aspects. Accordingly, the appended claims encompass all such changes and modifications as fall within the true spirit and scope of this invention.

We claim:

1. A programmable logic block within a programmable logic device, comprising:
    at least two interconnected slices, each of the interconnect slices including at least two interconnected lookup tables, each lookup table (LUT) adapted to receive input signals from a routing structure and to provide a LUT output signal,
    wherein at least a first slice includes a register adapted to register the LUT output signal of a lookup table as an output signal of the slice and at least a second slice includes fewer such registers than lookup tables.

2. The programmable logic block of claim 1, wherein the second slice comprises:
    two interconnected lookup tables;
    a register; and
    a multiplexer coupled between the lookup tables and the register, the multiplexer adapted to select an input signal for the register from among the two LUT output signals of the lookup tables and a data input signal to the slice.

3. The programmable logic block of claim 1, wherein the second slice comprises:
    four interconnected lookup tables;
    first and second registers;
    a first multiplexer coupled between first and second lookup tables and the first register, the first multiplexer adapted to select an input signal for the first register from among the two LUT output signals of the first and second lookup tables and a first data input signal to the slice; and
    a second multiplexer coupled between third and fourth lookup tables and the second register, the second multiplexer adapted to select an input signal for the second register from among the two LUT output signals of the third and fourth lookup tables and a second data input signal to the slice.

4. The programmable logic block of claim 1, wherein the second slice comprises:
    two interconnected lookup tables;
    a register; and
    a multiplexer coupled between the lookup tables and the register, the multiplexer adapted to select an input signal for the register from the LUT output signal of only one lookup table and a data input signal to the slice.

5. The programmable logic block of claim 1, wherein the second slice comprises:
    four interconnected lookup tables;
    first and second registers;
    a first multiplexer coupled between first and second lookup tables and the first register, the first multiplexer adapted to select an input signal for the first register from the LUT output signal of only the first lookup table and a first data input signal to the slice; and
    a second multiplexer coupled between third and fourth lookup tables and the second register, the second multiplexer adapted to select an input signal for the second register from the LUT output signal of only the third lookup table and a second data input signal to the slice.

6. The programmable logic block of claim 1, wherein the second slice comprises two interconnected lookup tables but no registers for registering the LUT output signals of the interconnected lookup tables.

7. The programmable logic block of claim 1, wherein the second slice comprises four interconnected lookup tables but no registers for registering the LUT output signals of the interconnected lookup tables.

8. The programmable logic block of claim 1, wherein the number of registers within the interconnected slices of the block is at least half the number of interconnected lookup tables therein.

9. The programmable logic block of claim 1, wherein the number of interconnected slices within the programmable logic block is four, the number of interconnected lookup tables in each slice is two, and the number of registers within the four slices is six.

10. The programmable logic block of claim 9, wherein the number of registers in two slices is one each and the number of registers in two slices is two each, and in each of the slices having one register, the register is adapted to register the LUT output signal of only one interconnected lookup table.

11. The programmable logic block of claim 9, wherein the number of registers in two slices is one each and the number of registers in two slices is two each, and in each of the slices having one register, the register is adapted to register the LUT output signal of either of the two interconnected lookup tables.

12. The programmable logic block of claim 1, wherein the number of interconnected slices within the programmable logic block is four, the number of interconnected lookup tables in each slice is two, and the number of registers within the four slices is four.

13. The programmable logic block of claim 1, wherein the number of interconnected slices within the programmable logic block is two, the number of interconnected lookup tables in each slice is four, and the number of registers within the two slices is four.

14. The programmable logic block of claim 13, wherein the number of registers in one slice is zero and the number of registers in the other slice is four.

15. The programmable logic block of claim 13, wherein the number of registers in each slice is two, and each register in each slice is adapted to register the LUT output signal of only one interconnected lookup table.

16. The programmable logic block of claim 13, wherein the number of registers in each slice is two, and each register in each slice is adapted to register the LUT output signal of either of two interconnected lookup tables.

17. The programmable logic block of claim 1, wherein the number of interconnected slices within the programmable logic block is four, the number of interconnected lookup tables in each slice is four, and the number of registers within the four slices is twelve.

18. The programmable logic block of claim 1, wherein the number of interconnected slices within the programmable logic block is four, the number of interconnected lookup tables in each slice is four, and the number of registers within the four slices is eight.

19. A programmable logic block within a programmable logic device, comprising:
three interconnected slices, each of the interconnected slices including:
first and second interconnected lookup tables, each lookup table (LUT) adapted to receive input signals from a routing structure and to provide a LUT output signal;
first and second registers;
a first multiplexer coupled between the first lookup table and the first register, the first multiplexer adapted to select an input signal for the first register from the LUT output signal of the first lookup table and a first data input signal to the slice;
a second multiplexer coupled between the second lookup table and the second register, the second multiplexer adapted to select an input signal for the second register from the LUT output signal of the second lookup table and a second data input signal to the slice; and
a third multiplexer coupled to the first and second lookup tables and adapted to select from the LUT output signal of either of the two lookup tables; and
a fourth interconnected slice including two interconnected lookup tables but no registers for registering the LUT output signals of the interconnected lookup tables.

20. A programmable logic block within a programmable logic device, comprising:
two interconnected slices, each of the interconnect slices including four interconnected lookup tables, each lookup table (LUT) adapted to receive input signals from a routing structure and to provide a LUT output signal; and
no more than six registers within the two slices, each register adapted to register the LUT output signal of a lookup table as an output signal of a slice.

21. The programmable logic block of claim 20, wherein the number of registers in one slice is two and the number of registers in the other slice is four, and in the one slice having two registers, each register is adapted to register the LUT output signal of only one interconnected lookup table.

22. The programmable logic block of claim 20, wherein the number of registers in one slice is two and the number of registers in the other slice is four, and in the one slice having two registers, each register is adapted to register the LUT output signal of either of two interconnected lookup tables.

* * * * *